THERMOELECTRIC SYSTEM

Filed May 18, 1959

INVENTOR.
MILTON M. WALLER
BY Karl Huber
James E. Bryan
Alan C. Rose
ATTORNEYS 3,064,440
Patented Nov. 20, 1962

3,064,440

THERMOELECTRIC SYSTEM

Milton M. Waller, Plainfield, N.J., assignor to Nuclear Corporation of America, Denville, N.J., a corporation of Delaware Filed May 18, 1959, Ser. No. 813,738
8 Claims. (Cl. 62—3)

This invention relates to thermoelectric devices, and more particularly to thermoelectric assemblies of improved efficiency and stability.

It is well known that the application of direct current to the junction between two dissimilar conductors or semiconductors will heat or cool the junction depending on the polarity of the current. This is known as the Peltier effect. It has recently been proposed to use the thermoelectric cooling effect to reduce the operating temperature of sensitive electronic devices. In the case of infrared detection devices, for example, cooling the electronic viewing components greatly improves the optical resolution of the system. Similarly, in the case of some of the newer solid state amplifiers lower temperatures reduce the noise level and greatly increase sensitivity.

However, the thermoelectric cooling arrangements which which been proposed up to the present time have not been altogether satisfactory. In this regard, insufficient heat dissipation from the hot junction has been a limiting factor in some cases. In this regard, it may be noted that considerations of design or other requirements may preclude the use of cooling accessories such as a motor driven fan, for example. Another adverse factor has been the variations in the temperature of the cold junction with changes in the ambient temperature.

Accordingly, one important object of this invention is to increase the rate of heat dissipation at the reference junction of a thermoelement.

Another object of the invention is to stabilize the operating temperatures of a thermoelement.

These objects may advantageously be attained by the use of a reservoir arranged to contain a melting material in contact with the reference electrode of a thermoelement. In accordance with an illustrative embodiment of the invention, an infrared detection tube is enclosed by a circular thermoelectric device including a large number of pairs of thermoelements. The thermoelements are arranged with the cold junctions adjacent the infrared image forming tube and the hot junctions spaced outwardly away from the central tube. A reservoir for containing a melting substance is mounted to enclose the hot junctions and to be in heat transferring relationship with these hot junctions. The melting liquid may be water, and the reservoir is provided with a flexible wall to permit expansion of the water as it is solidified to ice. During the operation of the infrared device, heat is transferred from the hot junction to the reservoir and melts the ice in the reservoir. The ice has a high capacity to absorb heat and maintains the hot junction near the freezing point of water. In addition, there are no significant variations of the temperature of the hot junction with variations in the ambient temperature. Instead of using water in the reservoir, other compounds or eutectic alloys having melting points in the desired temperature range may be employed.

After a considerable time period of operation of the infrared device, all of the ice in the reservoir will be melted. The reservoir may then be removable from the infrared device, and a new reservoir containing ice may be substituted for the heated reservoir. The heated reservoir may then have its liquid re-frozen either by another thermoelectric arrangement or by conventional refrigeration techniques. Alternatively, where a prolonged off-duty cycle is practical, the reservoir may be re-frozen by passing current through its associated thermoelement in the opposite direction. In the case of infrared viewing devices, this is particularly practical as their principal usefulness is during the nighttime hours of darkness, and the liquid may be re-frozen in the daytime. During the re-freezing operation the central infrared image tube may be removed, and heat may be dissipated from the inner junctions by means of forced air cooling or the like.

In accordance with a feature of my invention a thermoelectric device is provided with a flexible reservoir adjacent one junction or set of junctions so that melting material may hold the junction or junctions at a desired temperature. In accordance with additional features of my invention, the material in the reservoir may be resolidified while the reservoir is separated from the device which is being cooled.

In accordance with another feature of the invention, an infrared image tube is provided with a thermoelectric cooling device having the cold junctions adjacent the tube and the hot junctions spaced outwardly from the tube. In addition, a reservoir for melting material is provided in heat transferring proximity to the hot junctions.

The arrangements described above have the advantage of maintaining the hot junction of a thermoelement at a desired temperature and of providing increased absorption of heat.

Other objects, features and advantages of the invention will become apparent from a consideration of the following detailed description and from the drawings, in which, FIGURE 1 is a cross-sectional view of an infrared image tube equipped with a thermoelectric assembly, in accordance with the invention.

Figure 1:
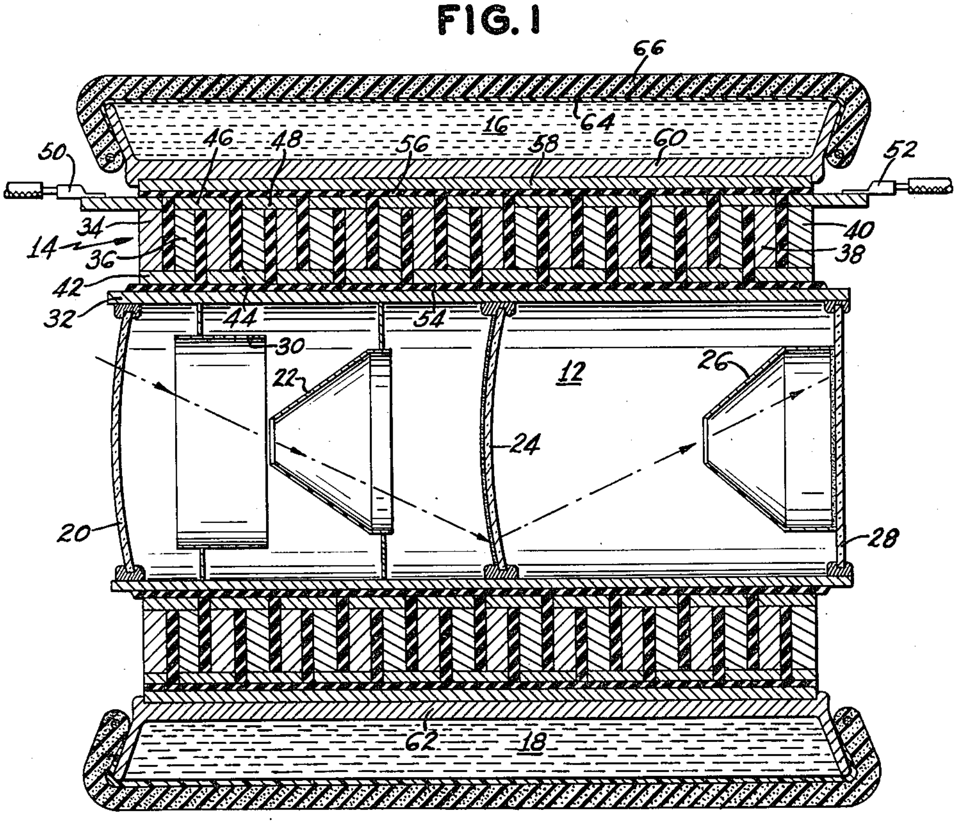

With reference to the drawings, FIGURE 1 shows an infrared tube 12 as the central element. The other two principal components of the assembly of FIGURE 1 are the composite thermoelement 14 and the outer cooling reservoir, including an upper section 16 and a lower section 18.

With regard to the infrared tube 12, it includes an input window 20, a first aperture 22, a glass membrane 24, a second aperture 26, and a viewing screen 28. The input window 20 and the glass membrane 24 both include photoemissive surfaces on the sides toward the right of FIGURE 1. The glass membrane 24 and the viewing screen 28 both have phosphor screens on their surfaces facing the input window 20. With suitable voltages applied to the electrode 30 and the additional elements 22 and 26, an infrared image picked up at window 20 is amplified by the glass membrane 24 with its phosphor screen and photoemissive surface, and the further intensified image appears on the viewing screen 28. Inasmuch as the construction of the infrared viewing tube per se is conventional, the details of its mode of operation will not be considered further.

The cylindrical metal envelope 32 enclosing the infrared tube should be maintained at a temperature well below the ambient. When this is done, there is no interference with the incoming infrared image by virtue of heat radiations from the tube structure per se. In order to cool the cylinder 32, the array of thermoelements 14 is provided. The composite thermoelectric structure 14 includes a stack of thermoelectric discs 34, 36, starting at the left of FIGURE 1 and extending to the elements 38 and 40 at the other end of the assembly. Alternate elements of the array are formed of different thermoelectric materials. Thus, for example, the element 34 could be of lead telluride or lead selenide or a combination of these materials, whereas the element 36 may be of a metal such as antimony or tellurium or an alloy of these two metals. In the early days of experimentation with thermoelectric devices, metals were generally used. In recent years however, it has been determined that higher conversion efficiencies may be obtained by the use of semiconductors. A number of specific pairs of thermoelements which may be used are set forth in a book entitled "Semiconductor Thermoelements and Thermoelectric Cooling," by A. F. Ioffe, published by Infosearch Limited, London, 1957. The composite thermoelement as specified above is proposed in this reference.

In view of the hardness of most thermoelectric materials, it is desirable to use softer facing elements to interconnect the thermoelectric material. Accordingly, the annular rings 42, 44, and so forth are provided at the inner surfaces of the thermoelectric elements, and the outer annular rings 46, 48, and so forth, which are of somewhat larger diameter, are employed to interconnect the outer surfaces of adjacent thermoelectric rings. By the arrangement as shown in FIGURE 1, a continuous series circuit is provided from one input terminal 50 secured to the thermoelectric element 34 through all of the other thermoelectric elements and interconnected pole pieces to the final thermoelectric ring 40 and its output terminal 52. Instead of a single series circuit, parallel circuitry or a series-parallel arrangement could be used, depending on the available voltages, and the geometry to be used.

To prevent short circuiting of adjacent thermoelectric elements, the insulating cylinders 54 and 56 are provided. It is desirable that these electrical insulating cylinders be relatively good conductors of heat. One suitable substance for this purpose is a very thin sheet of mica. This material may advantageously be secured in position by silicone varnish. A metallic cylinder 58 is secured to the thermoelements and spaced from them only by the insulating cylinder 56. This outer metallic cylinder 58 is the heat transferring component of the thermoelectric assembly 14.

The reservoirs 16 and 18 are removably secured to the thermoelectric assembly 14, in a manner which will be described below. When placed in position as shown in FIGURE 1, the central space of the reservoir 16 is filled with ice. As heat is transferred to the reservoir 16, the ice mealts to form water and absorbs heat through the metallic cylinder 58 and the rigid metallic frame members 60 and 62 of the reservoirs 16 and 18, respectively.

The outer peripheral closure of the reservoir 16 includes the resilient plastic or rubberized film 64 and a foam insulating layer 66. The resilient plastic film 64 is bulged outwardly when the water in the reservoir 16 is changed to ice. In a similar manner, it returns to the position as shown in FIGURE 1 when the ice is melted. Other arrangements for providing reservoirs of variable volume may also be provided. For example, metallic bellows may conveniently be used for the outer wall of the reservoirs.

Figure 2:
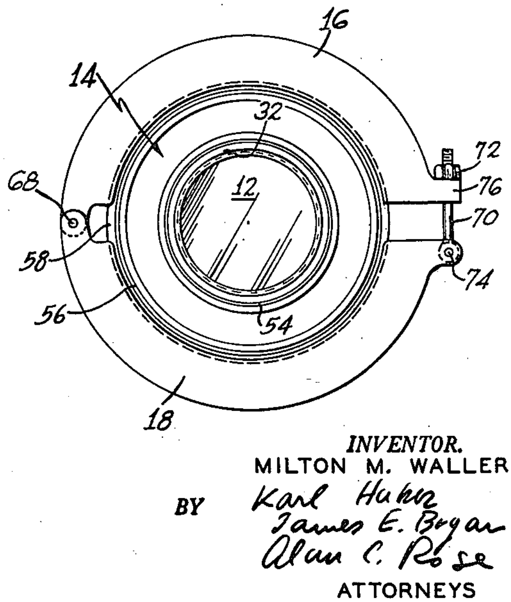
FIGURE 2 is an end view of a portion of the assembly of FIGURE 1.

FIGURE 2 shows an end view of the assembly of FIGURE 1 with the outer sealing element 64 and the insulating structure 66 removed. FIGURE 2 is included to bring out the removable nature of the pairs of reservoirs 16 and 18. This pair of reservoirs is provided with a simple form of hinge 68 and a conventional pivoted bolt arrangement 70 for holding the reservoir in place. When it is desired to remove the reservoirs from the assembly, the nut 72 is loosened and the bolt 70 which is located at one end of the reservoirs is pivoted about point 74 so that the nut 72 does not engage the slotted stud 76 which protrudes from the reservoir 16. Another bolt provided at the opposite end of the reservoirs must also be loosened prior to removal of the reservoirs.

Figure 3:
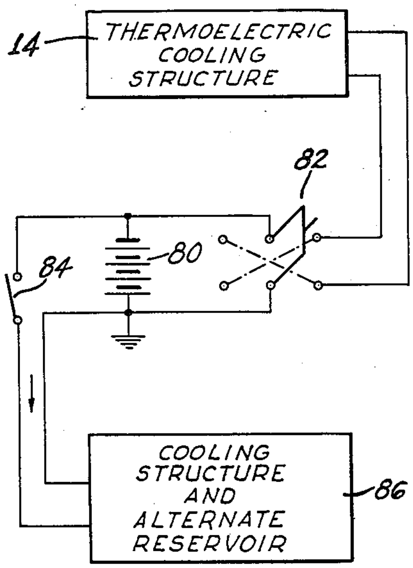
FIGURE 3 is a circuit diagram of the electrical system which may be employed in accordance with the present invention.

The circuit of FIGURE 3 includes a source of direct current 80, a double-throw, double-pole switch 82, a simple switch 84, the thermoelectric cooling structure 14, and an additional cooling structure and alternate reservoir designated 86. Under normal operating conditions of the infrared device of FIGURE 1, the double-poled, double-throw switch 82 is in one of its two positions. When it is desired to reverse the flow of current to the thermoelectric structure 14, the position of the double-poled, double-throw switch 82 is reversed. Under these circumstances, the inner junctions become hot, and the outer junctions of the assembly 14 become cold. The cooling effect at the reservoirs 16 and 18 may be sufficient to re-freeze the water in these reservoirs. As mentioned above, this action may be hastened by the removal of the infrared tube and the forced blowing of air past the inner junctions of the thermoelement 14.

A cooling structure and alternative reservoir 86 may also be provided. The cooling structure may, for example, be a duplicate of the thermoelement assembly 14. The alternative reservoir may in like manner be a duplicate of the hinged pair of reservoirs 16 and 18. Accordingly, while the reservoirs 16 and 18 are being used in conjunction with the infrared tube, the other pair of reservoirs may be cooled so that the water is frozen into ice. With this arrangement, by the time the ice in the reservoirs 16 and 18 is melted, the alternative reservoir is ready for installation and use. The switch 84 controls the application of direct current to the cooling structure 86.

It is to be understood that the above described arrangements are illustrative of the application of the principles of the invention. Numerous other arrangements may be devised by those skilled in the art without departing from the spirit and scope of the invention.

What is claimed is:

1. In combination, a thermoelectric cooling structure, means for supplying direct current to said structure to provide a hot junction and a cold junction, a reservoir for maintaining a body of melting substance in heat transferring relationship with said hot junction, a device requiring cooling in contact with said cold junction, means for separating said device and said reservoir, and means for resolidifying the material in said reservoir.

2. In combination, a thermoelectric cooling structure, means for supplying direct current to said structure to provide a hot junction and a cold junction, a reservoir in thermal contact with said hot junction, said reservoir including means for accommodating changes in volume of an enclosed material, a device requiring cooling in contact with said cold junction, means for separating said device and said reservoir, and means for resolidifying the material in said reservoir.

3. In combination, a generally cylindrical infrared image tube, a composite thermoelement having a plurality of junctions of one type adjacent the tube, and a plurality of junctions of the other type spaced outwardly from the tube, a reservoir in thermal contact with the outer junctions, said reservoir having at least one flexible side wall.

4. In combination, a generally cylindrical infrared image tube, a composite thermoelement having a plurality of junctions of one type adjacent the tube; and a plurality of junctions of the other type spaced outwardly from the tube, a reservoir in thermal contact with the outer junctions, and a substance having a critical change of state temperature in said reservoir, said reservoir including means for accommodating changes of volume of said substance as it changes state.

5. In combination, a thermoelectric cooling structure, means for supplying direct current to said structure to provide a hot junction and a cold junction, a reservoir for maintaining a body of melting substance in heat transferring relationship with said hot junction, a heat sensitive electronic device in contact with said cold junction, and means for separating said device and said reservoir.

6. In combination, a generally cylindrical infrared image tube, a composite thermoelement having a plurality of junctions of one type adjacent the tube, and a plurality of junctions of the other type spaced outwardly from the tube, a reservoir in thermal contact with the outer junctions, and water included within said reservoir, said reservoir including means for accommodating changes of volume of said water as it freezes and melts.

7. In combination, a thermoelement, a heat reservoir in contact with one type of junction of said thermoelement, a sensitive electronic component requiring cooling in contact with the other type of junction of said thermoelement, and means for selectively separating said electronic component and said reservoir and for quickly reassembling them in good heat conducting relationship with said thermoelement.

8. An image tube assembly including in combination a generally cylindrical infrared image tube, a composite thermoelectric structure comprising a plurality of hot junctions and a plurality of cold junctions, means mounting said thermoelectric structure on said tube with said structure substantially surrounding said tube with the junctions of one plurality adjacent the tube and the junctions of the other plurality of junctions spaced outwardly from the tube, a reservoir and means mounting said reservoir on said thermoelectric structure with the reservoir in thermal contact with the junctions of the other plurality of junctions.

References Cited in the file of this patent

UNITED STATES PATENTS

| | | |
|---|---|---|
| 413,136 | Dewey | Oct. 15, 1889 |
| 1,804,072 | Turrettini | May 5, 1931 |
| 2,003,414 | Allyene | June 4, 1935 |
| 2,154,933 | Hadsell | Apr. 18, 1939 |
| 2,602,302 | Poux | July 8, 1952 |
| 2,734,344 | Lindenblad | Feb. 14, 1956 |
| 2,777,975 | Aigrain | Jan. 15, 1957 |
| 2,872,788 | Lindenblad | Feb. 10, 1959 |
| 2,879,424 | Garbuny et al. | Mar. 24, 1959 |
| 2,886,618 | Goldsmid | May 12, 1959 |
| 2,919,553 | Fritts | Jan. 5, 1960 |